United States Patent
Senoo et al.

(10) Patent No.: US 6,989,627 B2
(45) Date of Patent: Jan. 24, 2006

(54) STACKED PIEZOELECTRIC DEVICE

(75) Inventors: Takeshi Senoo, Anjo (JP); Nozomu Okumura, Nagoya (JP); Yasuhiro Suzuki, Nagoya (JP); Isao Mizuno, Chiryu (JP); Akira Fujii, Toyoake (JP)

(73) Assignee: Denso Corporation, Kariya (JP)

( * ) Notice: Subject to any disclaimer, the term of this patent is extended or adjusted under 35 U.S.C. 154(b) by 128 days.

(21) Appl. No.: 10/776,332

(22) Filed: Feb. 12, 2004

(65) Prior Publication Data

US 2004/0169442 A1 Sep. 2, 2004

(30) Foreign Application Priority Data

Feb. 12, 2003 (JP) .............................. 2003-034172
Jan. 9, 2004 (JP) .............................. 2004-004475

(51) Int. Cl.
*H01L 41/08* (2006.01)

(52) U.S. Cl. ..................................... 310/363; 310/328

(58) Field of Classification Search ................ 310/328, 310/363, 364, 366
See application file for complete search history.

(56) References Cited

U.S. PATENT DOCUMENTS

| | | | |
|---|---|---|---|
| 5,163,209 A | * | 11/1992 | Harada et al. .............. 29/25.35 |
| 5,233,260 A | * | 8/1993 | Harada et al. .............. 310/328 |
| 6,437,488 B1 | * | 8/2002 | Sube et al. .................. 310/366 |
| 6,552,471 B1 | * | 4/2003 | Chandran et al. ........... 310/328 |
| 6,700,306 B2 | * | 3/2004 | Nakamura et al. .......... 310/328 |

FOREIGN PATENT DOCUMENTS

| | | |
|---|---|---|
| JP | 57-30308 | 2/1982 |
| JP | 2001-340851 | 12/2000 |
| JP | 2001-244519 | 9/2001 |
| JP | 2002-54526 | 2/2002 |

* cited by examiner

*Primary Examiner*—Mark Budd
(74) *Attorney, Agent, or Firm*—Nixon & Vanderhye P.C.

(57) ABSTRACT

A stacked piezoelectric device, which is inexpensive and excellent in electric transmission efficiency and little deterioration of strength of an internal electrode layer, is provided by having an internal electrode layer containing not less than 50 percent by weight of Cu element, and not more than 5 percent of a pore occurrence expressed by (B/A)×100 (%) wherein A is an area of an interface between the internal electrode layer and the piezoelectric layer and B is a sum of areas of pores which appear in the interface and have a diameter of not less than 0.1 micrometers. Preferably, a surface roughness Ra of the interface of the piezoelectric layer contacting the internal electrode layer is not more than 0.5 C ($\mu$m) wherein C is a thickness of the internal electrode layer in micrometers. The piezoelectric material constituting the piezoelectric layer preferably comprises PZT which is a Pb(Zr,Ti)O$_3$-based oxide having a perovskite structure.

11 Claims, 5 Drawing Sheets

STACKED PIEZOELECTRIC DEVICE

BACKGROUND OF THE INVENTION

1. Field of the Invention

The present invention relates to a stacked piezoelectric device used for a piezoelectric actuator and the like.

2. Description of the Related Art

A piezoelectric device composed of a piezoelectric material, such as a piezoelectric ceramic, is characterized by generating a force or displacement when a voltage is applied, and generating a voltage when a force is applied, and it has a wide range of application such as various actuators and sensors. A stacked piezoelectric device, which is a concept including a stacked piezoelectric actuator, comprising a plurality of piezoelectric layers composed of piezoelectric material, is often used in order to obtain large generated force or displacement, in particular, when it is used for an actuator and the like.

A common stacked piezoelectric device is fabricated by stacking piezoelectric material layers and internal electrode layers alternately, and then calcining the resulting stack in one body. A metal paste used as electrode material comprises a powder of noble metal, such as Ag—Pd, and a binder. As an internal electrode material, a metal paste further blended with a piezoelectric material component or an analogue thereof is used in order to prevent delamination (interlaminar peeling) due to the calcining shrinkage difference between a piezoelectric material and an internal electrode. See, for example, Japanese Unexamined Patent Publication No. 57-30308.

However, in this case, there has been a problem that crystals of the piezoelectric material, which are insulating material, deposit in the internal electrode layer after calcination, and pores essentially tend to occur because a metal paste contains a binder and, therefore, the conductive material in the internal electrode layer is not continuous, and the electric transmission efficiency from an internal electrode to a piezoelectric layer is lowered.

There has been also a problem that an internal electrode material containing noble metals, such as Ag—Pd, is expensive. Therefore, there is also an idea that Cu can be used as an internal electrode material in order to cut the cost. In this case, there is a problem that, as Cu is easier to oxidize than a noble metal, such as Ag—Pd, oxidation of Cu advances, with pores in the internal electrode layer and in the interface between a piezoelectric material layer and an internal electrode layer as the starting points, while in use and Cu oxide is produced and, thereby, the electric transmission efficiency further declines and delamination is caused due to a reduction in the strength of an electrode layer.

SUMMARY OF THE INVENTION

The present invention has been achieved in view of the problems of the prior art, and the object thereof is to provide a stacked piezoelectric device which is capable of reducing costs by using inexpensive Cu as internal electrode material, excels in electric transmission efficiency, and can prevent the strength of an internal electrode layer from decreasing.

According to the present invention, there is provided a stacked piezoelectric device comprising piezoelectric layers composed of a piezoelectric material and internal electrode layers containing Cu, each of the piezoelectric layers being stacked alternately with each of the internal electrode layers, wherein the internal electrode layer contains not less than 50 percent by weight of Cu element, and a pore occurrence expressed by (B/A)×100 (%) is not more than 5 percent wherein A is an area of an interface between the internal electrode layer and the piezoelectric layer and B is a sum of areas of pores which appear in the interface and have a diameter of not less than 0.1 micrometers.

A stacked piezoelectric device according to the present invention, as described above, employs a Cu-based material containing 50 percent by weight of Cu element as an internal electrode layer. Therefore, compared with conventional stacked piezoelectric devices employing a noble metal such as Ag—Pd and the like, material cost can be reduced significantly, and a cheaper stacked piezoelectric device can be obtained. Various metal materials such as a so-called pure Cu metal, Cu alloys, and the like can be used as a material of the above-mentioned Cu-based material.

Moreover, according to the present invention, there are very few pores which appear in an interface of an internal electrode layer with a piezoelectric layer as mentioned above. Therefore, a decline in the electric transmission efficiency resulting from existence of pores and the strength reduction of an internal electrode layer can be inhibited. More specifically, even if an internal electrode layer of the present invention is based on Cu which is comparatively easy to oxidize, the progress of Cu oxidation beginning at pores can be prevented, and the conduction and the strength of internal electrode layers can be inhibited satisfactorily from declining. On the other hand, when the above-mentioned pore occurrence exceeds 5 percent, there are too many pores to obtain the above-mentioned effects.

A diameter of a pore is defined as a length d of a diameter of a circle or a minor axis of an ellipse S which touches the outline of the pore 99 as shown in FIG. 10.

Thus, the present invention can provide a stacked piezoelectric device which is capable of a cost reduction by using inexpensive Cu as internal electrode material and can prevent the electric transmission efficiency and the strength of an internal electrode layer from decreasing.

DETAILED DESCRIPTION OF THE INVENTION

Figure 1:
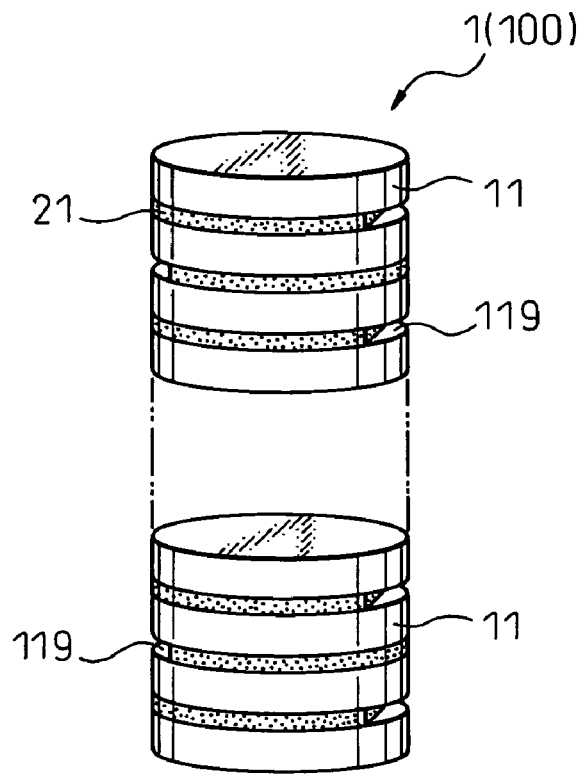
FIG. 1 is a diagram illustrating the structure of a stacked piezoelectric device according to Example 1.

A stacked piezoelectric device according to the present invention comprises a plurality of internal electrode layers and a plurality of piezoelectric layers, each internal electrode layer being stacked alternately with each piezoelectric layer. A thickness and an area of each internal electrode layer and piezoelectric layer as well as a number of layers are selected according to the intended use of a stacked piezoelectric device. The stacked piezoelectric device may have a structure comprising a so-called buffer part, dummy part, and the like at the stacking direction end of a stack of internal electrode layers and piezoelectric layers stacked alternately. A stacked piezoelectric device usually has a structure comprising an external electrodes connecting to internal electrode layers to supply voltage to the internal electrode layers through the external electrode and to obtain piezoelectric properties.

The internal electrode layer of the stacked piezoelectric device contains not less than 50 percent by weight of Cu. When the Cu content is less than 50 percent by weight, there are problems such as a decline in conductivity of the internal electrode layer. Although the permissible maximum Cu content is 100 percent by weight, it is practically difficult to realize 100 percent by weight of Cu from the constraint on production of Cu-containing material. Materials which can contain a high purity of Cu, such as Cu foil and Cu plating film, can be used as a material forming the internal electrode layer as mentioned later.

The content of Cu element in the internal electrode layer is preferably not less than 95.0 percent by weight. In such a case, the conductivity of the whole internal electrode layer can be easily secured, taking advantage of an excellent conductivity of Cu.

The content of Cu element in the internal electrode layer is most preferably not less than 99.0 percent by weight. Thereby, the very excellent conductivity can be secured to improve the displacement performance of the stacked piezoelectric device.

The internal electrode layer is preferably composed of a pure copper metal containing not less than 99.0 percent by weight of Cu element. In this case, as the internal electrode layer is formed using a pure copper metal, the internal electrode layer is easily formed. The shape of the pure copper metal includes, but is not limited to, Cu foil (copper foil).

The internal electrode layer may also be composed of copper alloys containing not less than 95 percent by weight of Cu element. In this case, various copper alloys can be used. Specific examples of copper alloys include a beryllium copper, a red brass, a phosphor bronze, and the like.

The pore occurrence is not more than 5 percent, and preferably not more than 3 percent. Thereby, the effect of preventing the decline of electric conductivity and the oxidation of an internal electrode layer can be further improved.

A surface roughness (arithmetic mean roughness) Ra of the interface of a piezoelectric layer contacting a internal electrode layer is preferably not more than 0.5 C ($\mu$m), more preferably 0.2 C ($\mu$m), wherein C is a thickness of the internal electrode layer in micrometer. Restricting the above-mentioned Ra to not more than 0.5 C ($\mu$m) can reduce a region where the piezoelectric layers sandwiching an internal electrode layer contact directly mutually in such a state as piercing the internal electrode layer, and thereby can inhibit the electric transmission efficiency from declining. In order to demonstrate such an effect more certainly, it is more preferable that the above-mentioned Ra is not more than 0.2 C ($\mu$m).

On the other hand, when the above-mentioned Ra exceeds 0.5 C ($\mu$m), there is a possibility of increasing a region where protrusions in an uneven surface of a piezoelectric layer contact the next piezoelectric layer directly in such a state as piercing an internal electrode layer, and of causing a decline in the electric transmission efficiency by the increase in a region occupied by the insulating material in the internal electrode layer.

The surface roughness (arithmetic mean roughness) Ra can be measured according to JIS-B0601.

A pore abundance is defined as (D/C)×100 (%) wherein C is a thickness of the internal electrode layer in micrometer and D is a size of a pore in the thickness direction of the internal electrode layer in micrometer. The pore abundance in an internal electrode layer is preferably not more than 5 percent. When the pore abundance exceeds 5 percent, there is the same problem as when the above-mentioned pore occurrence exceeds 5 percent.

It is preferable that the piezoelectric material constituting the piezoelectric layer comprises PZT which is a Pb(Zr,Ti)O$_3$-based oxide having a perovskite structure. Various ceramic materials capable of exerting piezoelectric properties can be used as a piezoelectric material constituting the piezoelectric layer. In particular, the above-mentioned PZT (lead zirconate titanate) is the most suitable for a piezoelectric layer of a stacked piezoelectric device as it has very excellent piezoelectric properties.

The stacked piezoelectric device preferably is a piezoelectric actuator for an injector used as a driving source of an injector. An injector is equipped in an automobile and the like and is used as fuel injection equipment of an internal combustion engine, and the environment in which it is used is very severe. Therefore, an injector with a built-in stacked piezoelectric device having an excellent electric transmission efficiency and strength of an internal electrode layer as a piezoelectric actuator is excellent in reliability and durability.

A stacked piezoelectric device according to the present invention can be fabricated, for example, by a method comprising the steps of:

a piezoelectric layer calcination step of calcining a ceramic green sheet as a piezoelectric material to obtain a piezoelectric layer;

a stack fabrication step of stacking the piezoelectric layers alternately with layers of electrode material containing Cu to fabricate a stack; and a heat-bonding step of bonding internal electrode layers consisting of the electrode material and the piezoelectric layers by heating the stack at a temperature higher than 750 degrees centigrade, preferably higher than 850 degrees centigrade, and not higher than the melting point of Cu in an oxidation-inhibiting atmosphere for inhibiting Cu from oxidizing while a predetermined load is applied to the stack in the stacking direction.

This method performs the stack fabrication step and the heat-bonding step after performing the piezoelectric layer calcination step of obtaining a calcined piezoelectric layer beforehand as mentioned above. Therefore, the stacked piezoelectric device can be fabricated without having any influence of calcination treatment for obtaining piezoelectric layers upon internal electrode layers.

The heat-bonding step is performed, as mentioned above, in an oxidation-inhibiting atmosphere for inhibiting Cu from oxidizing while a predetermined load is applied to the stack in the stacking direction. The heating temperature is controlled to the temperature range higher than 750 degrees centigrade, preferably higher than 850 degrees centigrade, and not higher than the melting point of Cu. When the heating temperature is not higher than 750 degrees centigrade, a sufficient bonding strength between an internal electrode layer and a piezoelectric layer cannot be obtained. On the other hand, when the heating temperature is higher than the melting point of Cu which is about 1083 degrees centigrade, there is a problem that it is difficult to form homogeneous internal electrode layers.

The load applied to the stack needs to be large enough to sufficiently bond a piezoelectric layer and an electrode material together without causing damage to a piezoelectric layer, and the optimum value of the load varies with the composition of the piezoelectric material constituting the piezoelectric layer, the thickness of the piezoelectric layer, and the like. For example, when a piezoelectric layer is PZT with a thickness of about 100 micrometers, the load is preferably 1 to 10 MPa.

By performing the heat-bonding step under the above-mentioned conditions, the internal electrode layer with a Cu base can bond sufficiently to the piezoelectric layer without forming pores, and a stacked piezoelectric device excellent in electric transmission efficiency and the strength of internal electrode layers can be obtained.

EXAMPLES

Example 1

A stacked piezoelectric device according to an example of the present invention will be explained with reference to FIGS. 1 to 5.

A stacked piezoelectric device 1 according to this example comprises piezoelectric layers 11 consisting of a piezoelectric material and internal electrode layers 21 containing Cu, and each of the piezoelectric layers 11 is stacked alternately with each of the internal electrode layers 21 as shown in FIG. 1.

The internal electrode layer 21 contains not less than 50 percent by weight of Cu. A pore occurrence expressed by (B/A)×100 (%) is not more than 5 percent, wherein A is an area of an interface between the internal electrode layer 21 and the piezoelectric layer 11 and B is a sum of areas of pores which appear in the interface and have a diameter of not less than 0.1 micrometers.

A detailed explanation will be given below.

To fabricate the above-mentioned stacked piezoelectric device 1, a piezoelectric layer calcination step of calcining a ceramic green sheet as a piezoelectric material to obtain the piezoelectric layer 11 is performed.

In this example, to adopt PZT as the above-mentioned piezoelectric layer 11, a green sheet was prepared as follows. First, powders of lead oxide, zirconium oxide, titanium oxide, niobium oxide, strontium carbonate and the like making up the main materials of the piezoelectric material were weighed to obtain a predetermined composition. These component elements, however, were prescribed with lead richer by 1 to 2 percent than the stoichiometric composition, taking the volatilization of the lead component into consideration. The material thus prepared was dry mixed in a mixer and thereafter calcined at 800 to 950 degrees centigrade.

Subsequently, pure water and a dispersing agent were added to the resulting calcined powder to form a slurry, which was wet ground by a pearl mill. The powder thus ground was dried, degreased, added with a solvent, a binder, a plasticizer, a dispersing agent and the like, and mixed in a ball mill. Thereafter, the resulting slurry was vacuum degassed while agitating by an agitator in a vacuum device to control viscosity.

Subsequently, the slurry was formed into a green sheet of a predetermined thickness by a doctor blade machine.

The resulting green sheet was punched in a press or cut by a cutter into a circular shape having a diameter of 15 millimeters. Of course, the green sheet may be formed into a quadrangle form, an ellipse form, a barrel form, or the like according to a desired shape of a stacked piezoelectric device.

Subsequently, in this example, the green sheet was degreased at 400 to 700 degrees centigrade in an electric furnace for a predetermined time and thereafter calcined at 900 to 1200 degrees centigrade for a predetermined time to obtain a piezoelectric layer 11. Thus, a calcined piezoelectric layer 11 having a thickness of 100 micrometers and consisting mainly of PZT which is a $Pb(Zr,Ti)O_3$-based oxide having a perovskite structure was obtained in this example.

In this example, a surface roughness of the obtained piezoelectric layer 11 was measured according to JIS-B0601. As a result, the surface roughness (arithmetic mean roughness) Ra was within the range of 0.5 to 1.2 micrometers. Since a thickness C of the internal electrode layer 21 is about 3 micrometers as mentioned later, the surface roughness is thoroughly within the range of not more than 1.5 micrometers which is 0.5 C ($\mu$m)

Figure 3:
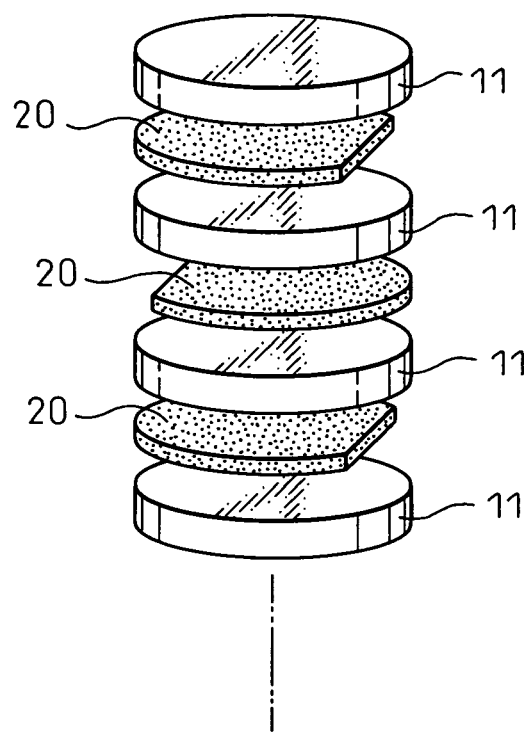
FIG. 3 is a perspective exploded view illustrating the stacking of piezoelectric layers and internal electrode layers according to Example 1.
Figure 4:
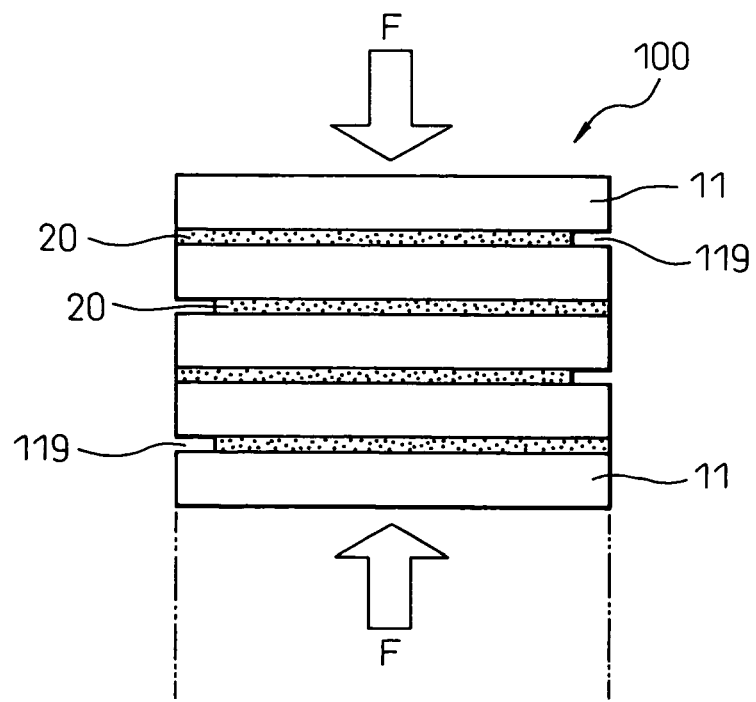
FIG. 4 is a diagram illustrating the application of a load to a stack in the stacking direction in a heat-bonding step according to Example 1.

Subsequently, as shown in FIGS. 3 and 4, a stack fabrication step was performed to stack the obtained piezoelectric layers 11 alternately with layers of electrode material 20 containing Cu.

Figure 2:
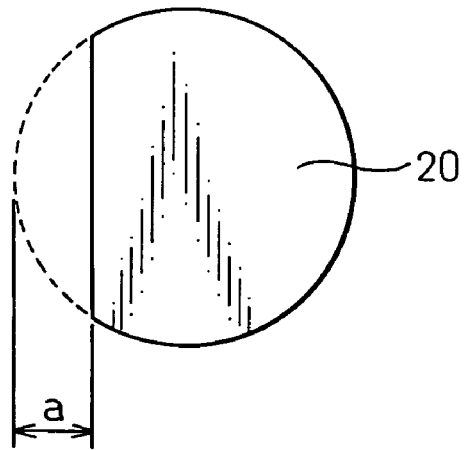
FIG. 2 is a diagram illustrating the shape of an electrode material used as an internal electrode layer according to Example 1.

In this example, a copper foil consisting of Cu having a purity of 99.9 percent and having a thickness of 3 micrometers was used as an electrode material 20. The used copper foil had a shape obtained by cutting off a part of a circle having a diameter of 15 millimeters in a straight line inside the periphery so that a distance a from the periphery may be 4 millimeters as shown in FIG. 2. Each electrode material 20 was placed so that the cut-off part thereof might be located in the opposite side alternately with that of the next electrode material as shown in FIGS. 3 and 4, and piezoelectric layers 11 and electrode materials 20 were stacked so that missing portions 119, where the electrode material 20 (internal electrode layer 21) does not cover the piezoelectric layer 11, might be formed with alternation of right and left, and a stack 100 was obtained as shown in FIGS. 1 and 4. In this example, fifty (50) piezoelectric layers 11 were stacked.

Subsequently, as shown in FIG. 4, a heat-bonding step of bonding the internal electrode layers 21 consisting of the electrode material 20 and the piezoelectric layers 11 was performed by heating the stack 100 at a temperature higher than 750 degrees centigrade, preferably higher than 850 degrees centigrade, and not higher than the melting point of Cu in an oxidation-inhibiting atmosphere for inhibiting Cu from oxidizing while a predetermined load F was applied to the stack 100 in the direction of stacking.

More specifically, the stack 100 was placed in a furnace while a load F of about 3 MPa was applied in the direction of stacking. Subsequently, the inside of the furnace, in which the stack 100 was placed, was evacuated to a vacuum degree of $1\times10^{-2}$ Pa and, thereafter, $N_2$ gas, as an inert gas, was introduced into the furnace so that a pressure of 10 Pa was maintained in the furnace.

Specifically, the stack was heated at a temperature of 960 degrees centigrade for about 10 minutes.

In a stacked piezoelectric device 1 obtained according to the above-mentioned heat-bonding step, a piezoelectric layer 11 and an internal electrode layer 21 bond firmly to each other while each internal electrode layer 21 was exposed alternately to the opposite side as shown in FIG. 1. The internal electrode layer 21 maintained a thickness C of about 3 micrometers.

In this example, a section perpendicular to the stacking direction of an interface between a piezoelectric layer 11 and an internal electrode layer 21 was observed by a metallographic microscope at a magnification of 200 times. The result showed that the piezoelectric layer 11 and the internal electrode layer 21 adhered completely to each other and that there were no pores in the interface.

The stacked piezoelectric device 1 according to this example employs a Cu-based material containing 95 percent by weight of Cu as an internal electrode layer 21. Therefore, compared with conventional stacked piezoelectric devices employing a noble metal such as Ag—Pd and the like, a material cost can be reduced significantly, and a cheaper stacked piezoelectric device can be obtained.

As mentioned above, no pores were observed in an internal electrode layer of the above-mentioned stacked piezoelectric device 1. That is, the above-mentioned stacked piezoelectric device had a pore occurrence of 0 percent. Thereby, a decline in the electric transmission efficiency resulting from existence of pores and reduction of the strength of the internal electrode layer 21 can be prevented. Moreover, even if it employs the internal electrode layer 21 composed mainly of Cu which is comparatively easy to oxidize, progress of Cu oxidation beginning at pores can be prevented, and the conduction and strength of internal electrode layers can be inhibited satisfactorily from declining.

Next, an exemplified practical use of the stacked piezoelectric device 1 according to this example will be explained. First, an epoxy-based resin is applied over the circumferential side surface of the stacked piezoelectric device 1 and degassed in vacuum, and thereafter heat-treated at a temperature of 180 degrees centigrade for 10 minutes. Thereby, the missing portions 119, which are gaps between one piezoelectric layer 11 and another resulting from the cut-off parts of the internal electrode layers 21 made of Cu foils as mentioned above, are filled with a filling 118 consisting of the epoxy-based resin.

Figure 5:
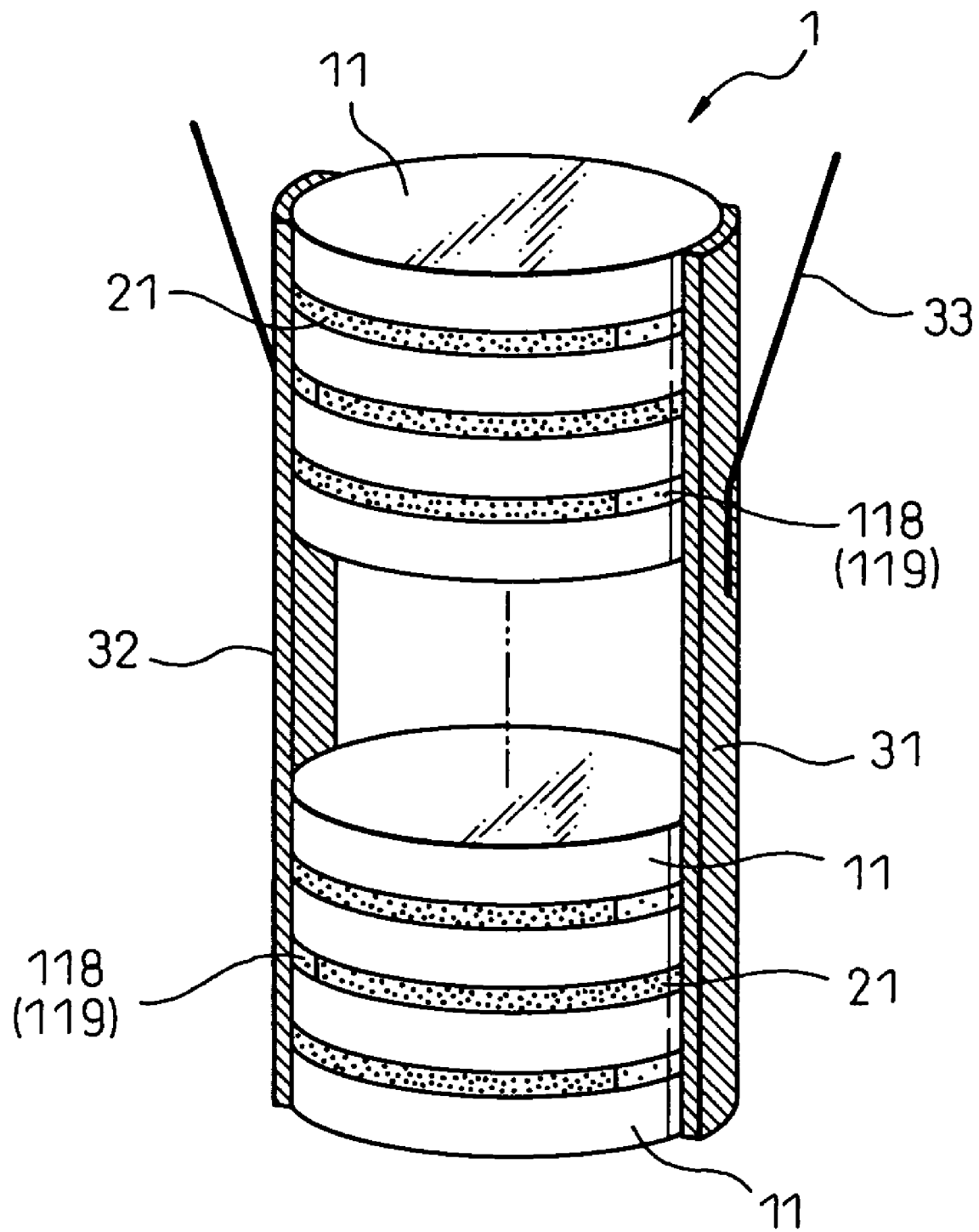
FIG. 5 is a diagram illustrating one embodiment of use of a stacked piezoelectric device according to Example 1.

Subsequently, as shown in FIG. 5, after grinding the circumferential side surface of the stacked piezoelectric device 1 to a diameter of 10 millimeters, a pair of external electrodes 31, 32 are formed by coating an epoxy-based electroconductive adhesive containing Ag filler on two opposite areas having the missing portions 119 of the circumferential side surface. Moreover, lead wires 33, 34 are connected to the external electrodes 31, 32.

The stacked piezoelectric device 1 thus formed can be made into an available stacked piezoelectric device (stacked piezoelectric actuator) by immersing it in an insulating oil and polarizing it by application of a direct current voltage through the lead wires 33, 34.

Example 2

In this example, in order to clarify further the superiority of the stacked piezoelectric device 1 obtained in Example 1, comparative samples (Samples 2 to 6) with pores having a diameter of not less than 0.1 micrometers formed intentionally between the internal electrode layer 21 and the piezoelectric layer 11 were prepared, and a test for evaluating the influence which a pore occurrence has on properties of a stacked piezoelectric device was performed.

The stacked piezoelectric device 1 according to Example 1 is referred to as Sample 1.

Comparative samples (Samples 2 to 6) were prepared in the same manner as in Example 1 except reducing each load applied in the direction of stacking in the heat-bonding step.

Figure 7:
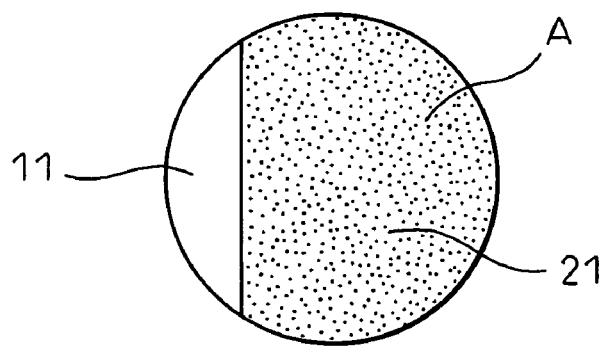
FIG. 7 is a diagram illustrating an area A of the interface for determining a pore occurrence in Example 2.
Figure 8:
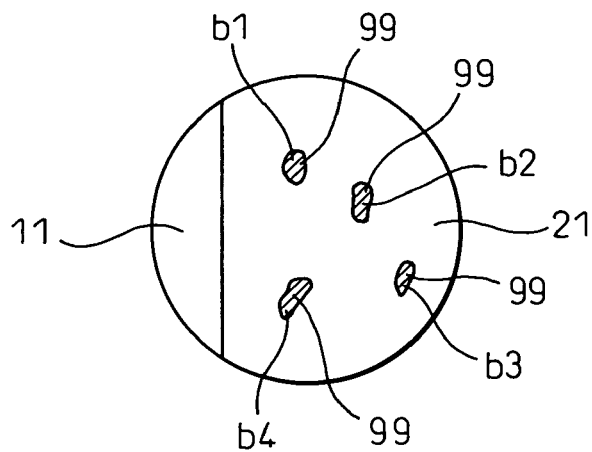
FIG. 8 is a diagram illustrating a sum B of areas of pores for determining a pore occurrence in Example 2.

A pore occurrence of each sample was determined as $(B/A) \times 100$ (%) wherein A is an area of an interface between the internal electrode layer 21 and the piezoelectric layer 11 and B is a sum of areas of pores which appear in the interface and have a diameter of not less than 0.1 micrometers. As a result, pore occurrences of Samples 1, 2, 3, 4, 5 and 6 were 0, 3, 5, 10, 20, and 30 percent, respectively. In determination of these values, the area A of an interface between the internal electrode layer 21 and the piezoelectric layer is the same as the whole area of the internal electrode layer 21 as shown in FIG. 7. When a plurality of pores 99 appear in the interface between the internal electrode layer 21 and the piezoelectric layer 11, B is defined, for example, as the sum of the areas b1, b2, b3 and b4 as shown in FIG. 8.

Subsequently, a direct current electric field of 1.9 kV/mm was applied to each sample through the lead wires 33, 34, and the displacement of each sample was measured by a laser displacement gauge. The measured result was expressed as a displacement ratio, which is defined as a ratio of a displacement amount of each sample to displacement of Sample 1.

Figure 6:
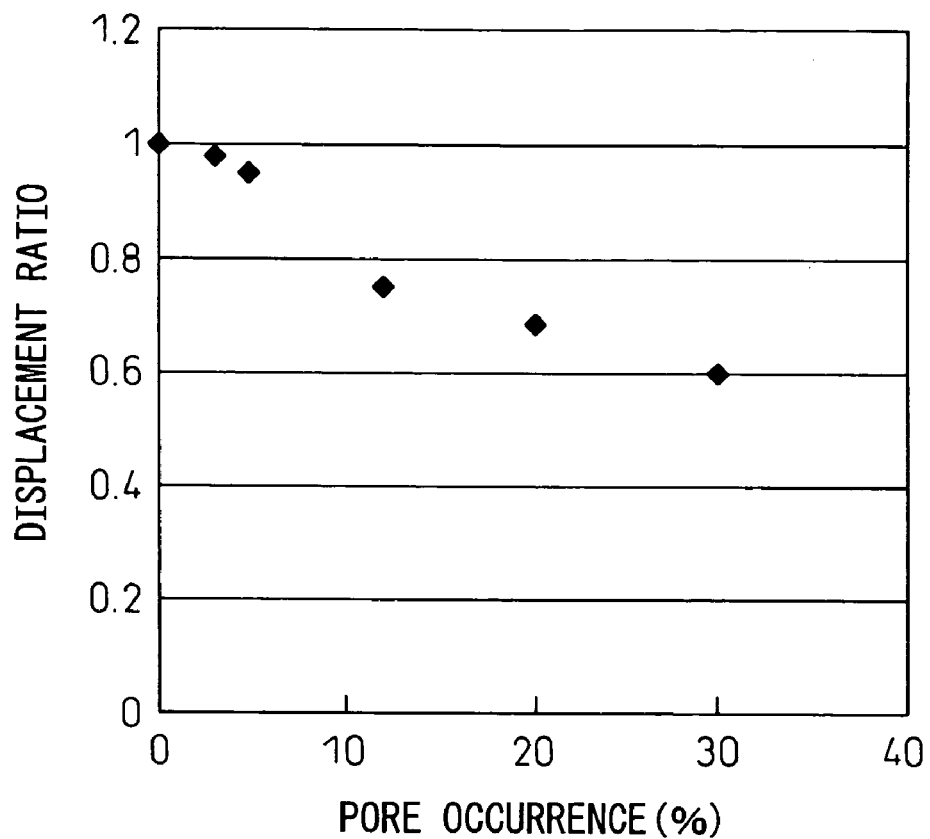
FIG. 6 is a diagram showing the relation between pore occurrence and displacement ratio in Example 2.

The test result is shown in FIG. 6, which shows a pore occurrence (%) along the abscissa and a displacement ratio along the ordinate.

As seen in FIG. 6, the greater the pore occurrence is, the more the displacement is reduced and the property of the stacked piezoelectric device is degraded. It is considered that the existence of pores blocks an electric transfer from an internal electrode layer to a piezoelectric layer, and the piezoelectric layer in that area becomes inert.

Example 3

Figure 9:
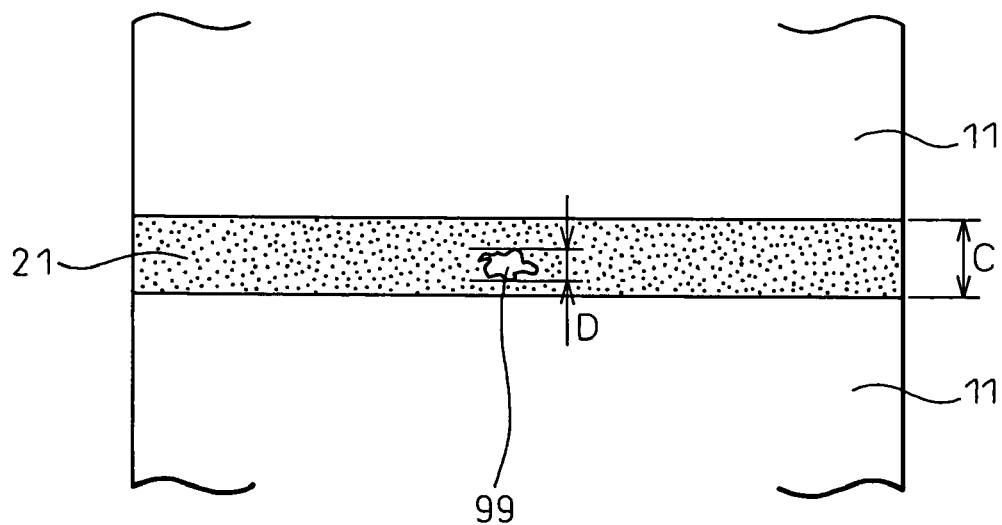
FIG. 9 is a diagram illustrating an internal electrode layer thickness C and a pore size D for determining pore abundance in Examples 3 and 4.
Figure 10:
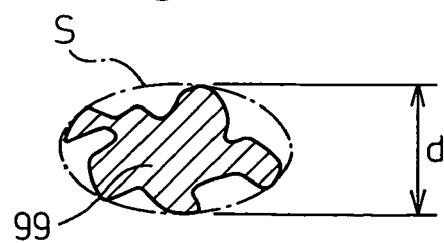
FIG. 10 is a diagram illustrating a diameter of a pore in the present invention.

In this example, a section parallel to the stacking direction of a stacked piezoelectric device 1 prepared in Example 1 was observed by a scanning electron microscope at a magnification of 1000 times, which showed that there were no pores in the thickness direction of the internal electrode layer 21. When a pore abundance is defined as $(D/C) \times 100$ (%) wherein C is a thickness of an internal electrode layer 21 in micrometers and D is a size of a pore 99, if any, in the thickness direction of an internal electrode layer 21 in micrometers as shown in FIG. 9, the stacked piezoelectric device 1 according to Example 1 had a pore abundance of 0 percent.

Example 4

In this example, instead of a copper foil (Cu foil) used in Example 1, Cu was plated nonelectrolytically on both the principal planes of a piezoelectric layer 11. Plated piezoelectric layers and non-plated piezoelectric layers were stacked alternately, and then heat-bonded in the same manner as in Example 1 to obtain a stacked piezoelectric device comprising internal electrode layers 21 composed of the nonelectrolytic Cu plating film. This internal electrode layer 21 contained 99.5 percent by weight of Cu element.

As a result of observing a section of this sample by a scanning electron microscope at a magnification of 1000 times in the same manner as mentioned above, a pore abundance (D/C)×100 (%) in the thickness direction of an internal electrode layer was found to be 3 percent.

What is claimed is:

1. A stacked piezoelectric device comprising piezoelectric layers composed of a piezoelectric material and internal electrode layers containing Cu, each of the piezoelectric layers being stacked alternately with each of the internal electrode layers, wherein the internal electrode layer contains not less than 50 percent by weight of Cu element, and a pore occurrence expressed by (B/A)×100 (%) is not more than 5 percent wherein A is an area of an interface between the internal electrode layer and the piezoelectric layer and B is a sum of areas of pores which appear in the interface and have a diameter of not less than 0.1 micrometers.

2. A stacked piezoelectric device according to claim 1, wherein the internal electrode layer contains not less than 95.0 percent by weight of Cu element.

3. A stacked piezoelectric device according to claim 1, wherein the internal electrode layer contains not less than 99.0 percent by weight of Cu element.

4. A stacked piezoelectric device according to claim 1, wherein the internal electrode layer is composed of a pure copper metal containing not less than 99.0 percent by weight of Cu element.

5. A stacked piezoelectric device according to claim 1, wherein the internal electrode layer is composed of a copper alloy containing not less than 95.0 percent by weight of Cu element.

6. A stacked piezoelectric device according to claim 1, wherein the pore occurrence is not more than 3 percent.

7. A stacked piezoelectric device according to claim 1, wherein a surface roughness (arithmetic mean roughness) Ra of the interface of the piezoelectric layer contacting the internal electrode layer is not more than 0.5 C ($\mu$m) wherein C is a thickness of the internal electrode layer in micrometer.

8. A stacked piezoelectric device according to claim 1, wherein a surface roughness (arithmetic mean roughness) Ra of the interface of the piezoelectric layer contacting the internal electrode layer is not more than 0.2 C ($\mu$m) wherein C is a thickness of the internal electrode layer.

9. A stacked piezoelectric device according to claim 1, wherein a pore abundance expressed by (D/C)×100 (%) is not more than 5 percent wherein C is a thickness of the internal electrode layer in micrometers and D is a size of a pore in the thickness direction of the internal electrode layer in micrometers.

10. A stacked piezoelectric device according to claim 1, wherein the piezoelectric material constituting the piezoelectric layer comprises PZT which is a Pb(Zr,Ti)O$_3$-based oxide having a perovskite structure.

11. A stacked piezoelectric device according to claim 1, which is a piezoelectric actuator for an injector used as a driving source of an injector.

* * * * *